United States Patent [19]

Custode

[11] Patent Number: 4,694,565

[45] Date of Patent: Sep. 22, 1987

[54] METHOD OF MAKING HARDENED CMOS SUB-MICRON FIELD EFFECT TRANSISTORS

[75] Inventor: Frank Z. Custode, Norco, Calif.

[73] Assignee: Rockwell International Corporation, El Segundo, Calif.

[21] Appl. No.: 856,304

[22] Filed: Apr. 28, 1986

[51] Int. Cl.$^4$ .................. H01L 21/385; H01L 21/425
[52] U.S. Cl. ......................................... 437/34; 437/41
[58] Field of Search .................. 29/571, 578, 591; 148/187, 188

[56] References Cited

U.S. PATENT DOCUMENTS

| | | | |
|---|---|---|---|
| 4,210,993 | 7/1980 | Sunami | 29/571 |
| 4,224,733 | 9/1980 | Spaden | 29/571 |
| 4,231,051 | 10/1980 | Custode et al. | 29/589 X |
| 4,419,808 | 12/1983 | Tam et al. | 148/187 X |
| 4,477,962 | 10/1984 | Godejahn, Jr. | 29/591 X |
| 4,505,024 | 3/1985 | Kawate et al. | 29/591 X |
| 4,506,437 | 3/1985 | Godejahn, Jr. | 29/571 X |
| 4,519,126 | 5/1985 | Hsu | 29/571 |
| 4,590,663 | 5/1986 | Haken | 29/571 |
| 4,616,401 | 10/1986 | Takeuchi | 29/591 X |
| 4,621,412 | 11/1986 | Kobayashi et al. | 29/571 |

*Primary Examiner*—George T. Ozaki
*Attorney, Agent, or Firm*—H. Fredrick Hamann; George A. Montanye; Wilfred G. Caldwell

[57] ABSTRACT

The invention provides a novel high speed hardened CMOS structure and process for developing the structure. In a first embodiment, the <100> surface of the silicon wafer is preserved intact by building the field oxide above this surface so there is no transition from the <100> plane to the <111> plane. In a first embodiment, one of the gate electrode overlaps is avoided, thereby eliminating the sidewalk effect or parasitic device from causing leakage on that side of the channel. The preferred embodiment provides a device with no field oxide extending into the silicon wafer and with no overlap of the gate electrode over the field oxide. This is achieved by causing the gate metal interconnect to proceed linearly along the active region over either the source or drain before it leaves the active region, thereby avoiding the establishing of an extra field in the gate region. An alternative method for accomplishing the foregoing is to provide double metal layers and allow the gate metal interconnect to leave the active area directly from the gate electrode because the spacing is sufficient to render the metal interconnect field ineffective to cause parasitic problems; also, in this embodiment the metal interconnect can be run linearly along the active region and depart the same over the source or drain thereby even decreasing gate capacitance effects. A method for establishing sub-micron contacts is disclosed which permits manufacture of the CMOS devices to sub-micron dimensions.

8 Claims, 38 Drawing Figures

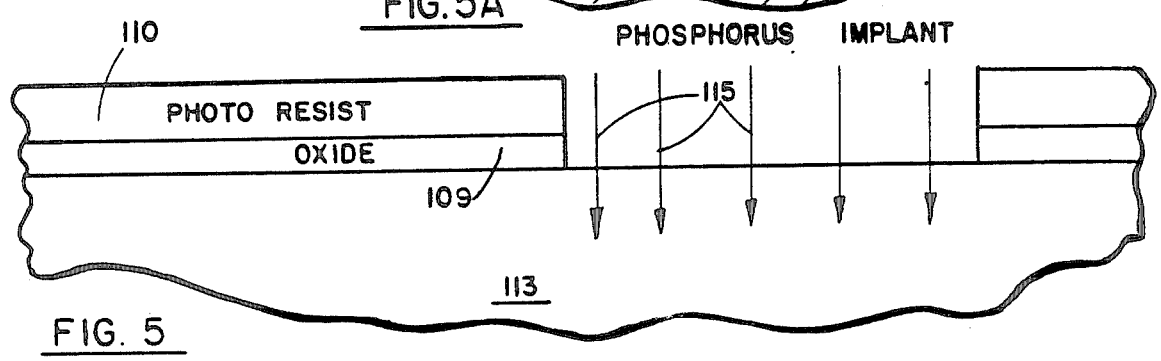
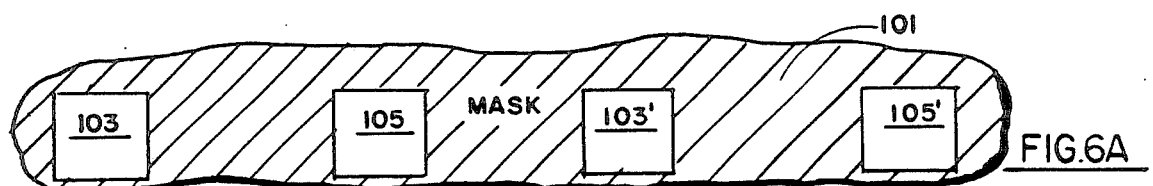
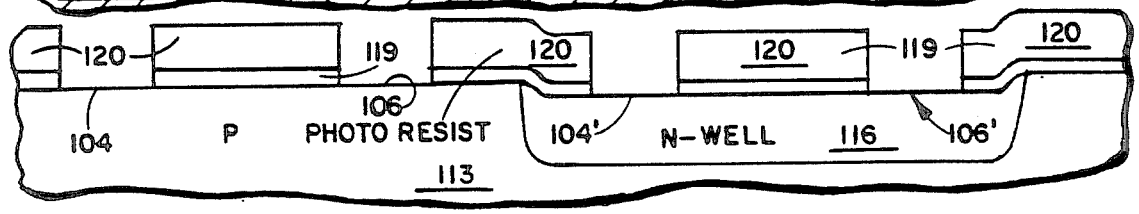
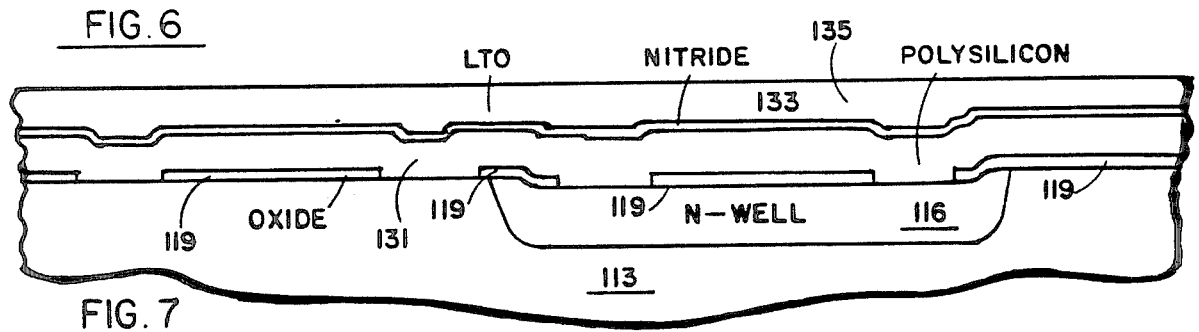
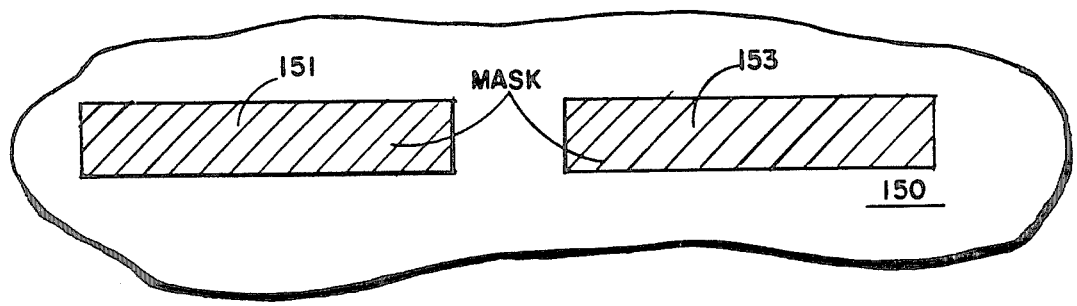

METHOD OF MAKING HARDENED CMOS SUB-MICRON FIELD EFFECT TRANSISTORS

This application includes subject matter related to the subject matter of a co-filed application entitled METHOD OF MAKING HARDENED NMOS SUB-MICRON FIELD EFFECT TRANSISTORS Ser. No. 856,302, filed Apr. 28, 1986 by the same inventor.

FIELD OF THE INVENTION

This invention relates to the field of CMOS processing, and, more particularly to higher speed, hardened self-aligned devices.

BACKGROUND OF THE INVENTION

In the past few years, substantial progress has been made in the development of radiation-hard technologies; however, most solutions are not compatible with VLSI objectives, such as packing density, speed performance or ease of implementation. The present invention resolves these problems for CMOS devices into sub-micron sizes.

DESCRIPTION OF THE PRIOR ART

Exposure to radiation tends to shift thresholds of n-channel devices into depletion and those of p-channels to higher values; furthermore, surrounding areas to the channel are also adversely affected because prior art gate electrodes overlap the field regions. In the prior art, these surrounding areas are characterized by a smooth transition from active to field areas as the thin oxide over channel regions converts to thick oxide over the field regions; hence, providing a vulnerable region to radiation effects in the form of "sidewalk" parasitic transistors. This phenomena is manifested by pronounced increase in leakage currents. Further, this problem is made more severe because the parasitic transition area is normally formed on a <111> plane as opposed to a <100> plane, where there is a propensity for charge build-up trapping. Since radiation induced $V_T$ (threshold voltage) shifts bear a $t_{ox}$ (oxide thickness) dependence, this sidewalk region is also affected, creating a parasitic device solely turned on by radiation exposures.

This invention makes use of principles described hereinafter and principles from the equation describing threshold voltage:

$$V_T = -(\epsilon_s - 2\phi_F)/2 + (Q_B - Q_{ss})t_{ox}/\epsilon_{ox} - (t_{ox}^2/\epsilon_{ox})\int_0^1 \mu\rho(\mu)d\mu$$

$V_T$ = threshold voltage (main or side parasitic transistors)
$\epsilon_s$ = permettivity of silicon
$\phi_F$ = Fermi potential
$Q_B$ = bulk charge
$Q_{ss}$ = oxide charge and interface charge
$t_{ox}$ = thickness oxide
$\epsilon_{ox}$ = permittivity of oxide
$\mu$ = interface charge
$\rho$ = function of space charge
$d\mu$ = derivative of interface charge The terms used in this expression are described to great extent in the literature. However, of particular interest are two terms: Qss and $\rho(\mu)$. These two terms have a greater impact on changing the threshold voltage of the parasitic sidewalk transistor. In the prior art, a sidewalk transistor is formed in the transition region between active device area and the field area isolating two distinct active areas. This transition region has a crystallographic orientation of <111> as opposed to <100>, rendering larger values of Qss (oxide charge and interface states). The $\rho(\mu)$ term within the integral can bring about significant shifts in threshold voltage, an increase in $\rho(\mu)$ which occurs under exposure to radiation harsh environments, will result in a negative shift establishing deleterious conduction paths, as shown in the drawings.

The closest known prior art is U.S. Pat. No. 4,231,051 which discloses techniques for manufacturing a Totally-Self-Aligned Transistor; here, gates, contacts, and active areas are aligned to each other as a result of induced self-alignment during fabrication.

The present invention and this patent are both assigned to the same entity, and the subject inventor is a co-inventor of the patent.

The present invention improves over the patent by a technique which eliminates "sidewalk" effects by creating a flat field, thus, eliminating the "<111>" transition region from active to field regions. Also, overlap of gate electrode over field regions is totally eliminated by routing gate electrode metal interconnect by running it over the source or drain, thus inducing radiation hardness.

SUMMARY OF THE INVENTION

The present invention enhances hardness tolerance by eliminating the gate electrode overlap and any otherwise parasitic transistor formed thereby. This is accomplished by:

1. Making the gate totally self-aligned with respect to source and drain regions, and, also the field regions, because the gate electrode is confined to the channel regions, while elimination of the <100> to <111> transitions by fabricating the field oxide from polysilicon disposed on top of the silicon bulk <100> surface.

2. Further, the self-alignment is enhanced by routing the gate electrode metal interconnect over the source or drain so as to prevent overlapping of any conductor over channel side regions.

3. Alternatively, the gate electrode metal interconnects can be accomplished with the use of self-aligned first metal plugs over polysilicon gates, and second level metal to complete the interconnect with heavy insulation between the second level metal and the substrate channel side regions, thus minimizing overlap effects.

4. Self-induced alignment minimizes the effect of most misalignments on device yield and reduces the area dedicated to a device to allow for mask misalignment. This results in tripling device density, and the invention provides for fabricating devices to the novel sub-micron sizes for CMOS structures/circuits. Self-aligned sub-micron contacts and gates are obtained by using $Si_3N_4$ to prevent oxidation of areas where contacts and gates are to be formed, while isolating oxide is grown elsewhere.

5. The p channel is also further hardened by reducing threshold voltage increase effects due to radiation, and its speed performance is improved due to decreased capacitance—all because of the reduction of or elimination of field oxide overlap by the gate interconnect.

6. CMOS density is increased by a factor of 3 because using the interrelated masks herein described, the active portion does not require expanded areas for source and drain contacts and the gate interconnect need not overlap the active region to accommodate for misalignment. The totally self-aligned contacts enable a linear active region of constant width.

BRIEF DESCRIPTION OF THE DRAWINGS

FIG. 5A shows the well mask for the p-channel devices;

FIG. 5 is a sectional view showing phosphorus implant in the p-channel device;

FIG. 6 illustrates the etching step controlled by the photoresist resulting from use of the mask of FIG. 6A;

FIG. 6A shows the CMOS contact mask for opening the gate oxide to bare silicon for the n and p channel sources and drains;

FIG. 7 shows the deposit of a polysilicon layer, silicon nitride layer and low temperature oxide layer;

FIG. 8 shows an active mask with opaque active regions for protecting both the NMOS and PMOS active regions;

DESCRIPTION OF THE PREFERRED EMBODIMENT

Figure 1:
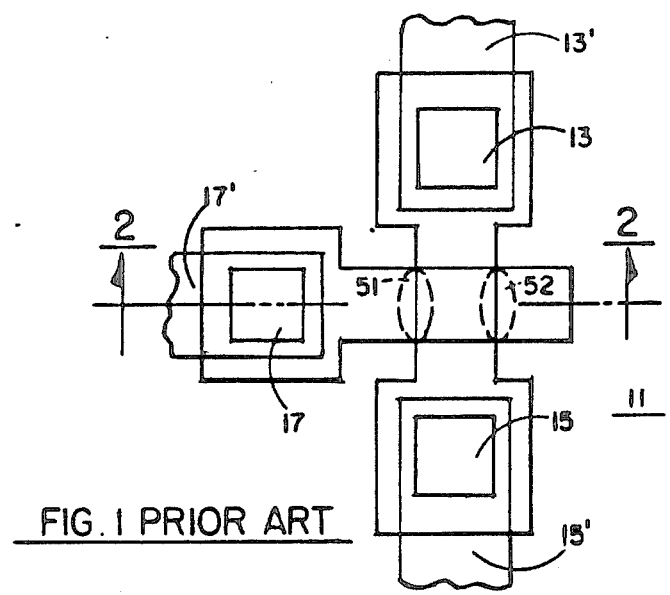
FIG. 1 is a top plan view of a prior art or conventional FET.
Figure 2:
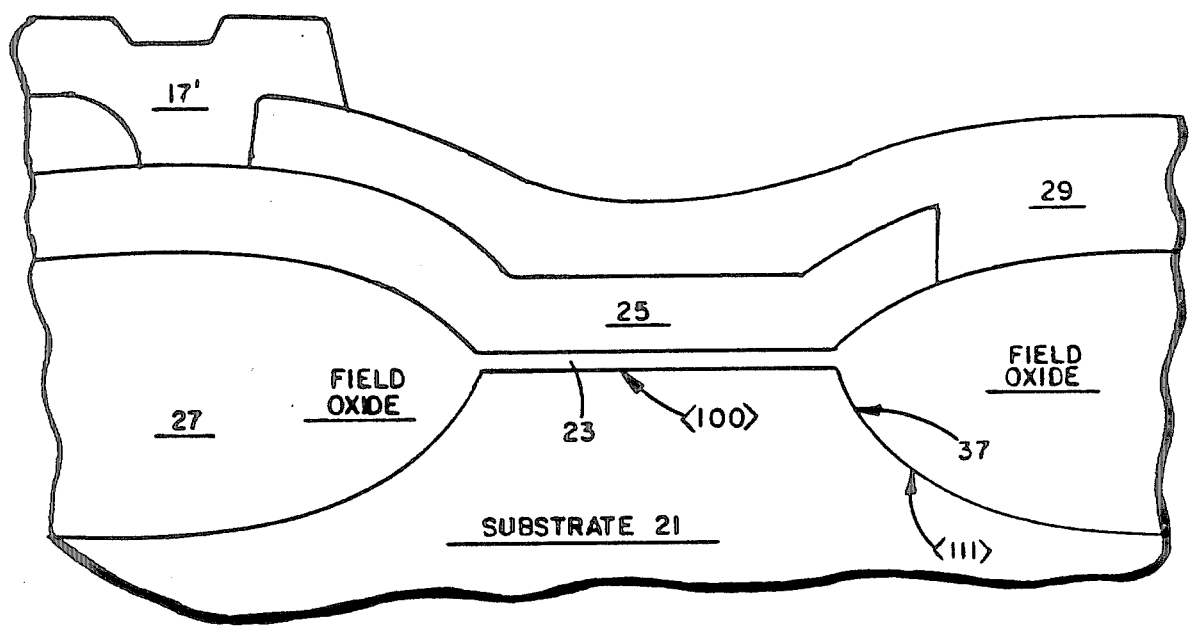
FIG. 2 is a view in section of the FET of FIG. 1, taken along the plane 2—2.

In general, FIGS. 1 and 2 show typical PRIOR ART FETs which exhibit the problem of double overlap and transition region.

Figure 3:
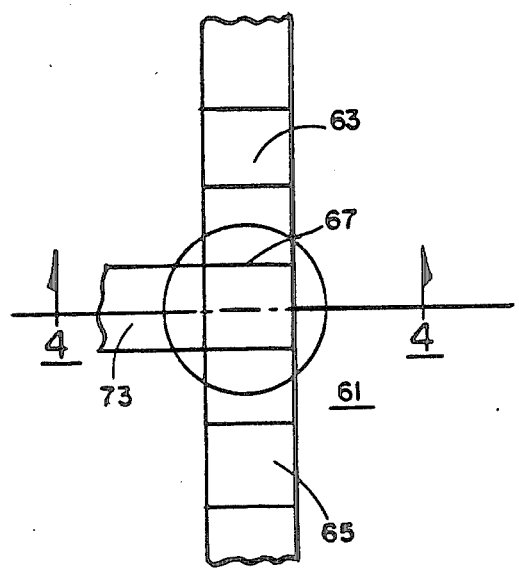
FIG. 3 is a top plan view of a FET fabricated in accordance with an embodiment of the present process.
Figure 4:
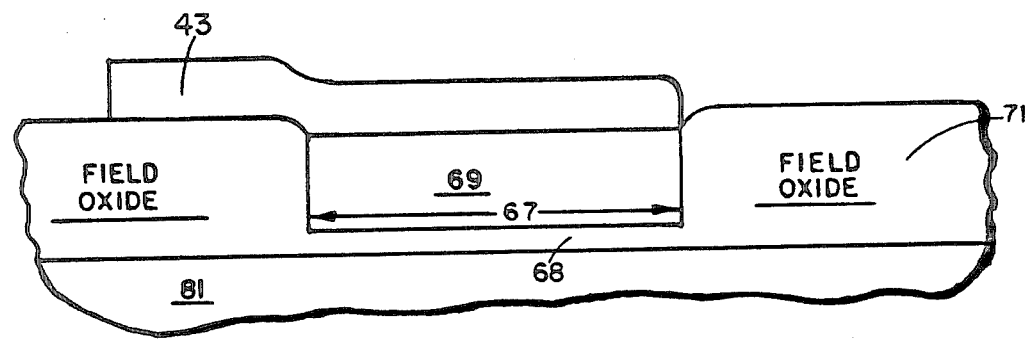
FIG. 4 is a view in cross section of the FET of FIG. 3 taken along the plane 4—4.
Figure 9:
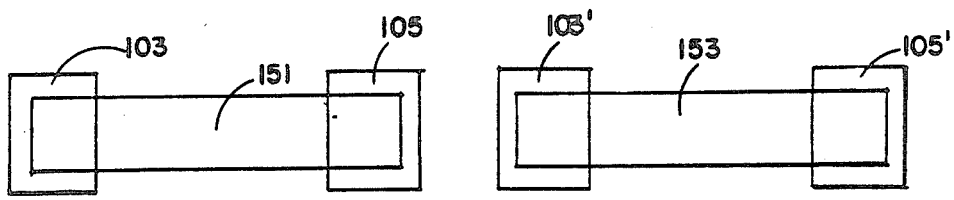
FIG. 9 shows the active mask over the contact mask.

FIGS. 3 and 4 illustrate how the first embodiment of the invention eliminates one overlap and the transition regions.

FIGS. 5 through 28 set forth a fabrication process for achieving CMOS devices having only the single overlap and no transition regions, as pictured in FIGS. 3 and 4.

FIGS. 29 through 31A illustrate a preferred modification of this process to provide CMOS devices without any overlap, i.e., totally self-aligned, and also without any field transition regions.

FIGS. 32 through 36 show a different type modification for providing a double metal CMOS device wherein the single overlap is sufficiently spaced from the field oxide as to overcome the effects of overlap.

In FIGS. 1 and 2, the PRIOR ART transistor or NMOS (or PMOS) device 11 is shown in plan view wherein the source contact is visible at 13, drain contact at 15 and gate contact at 17. The interconnecting metal for these contacts is shown respectively at 13', 15' and 17'. Note the large area required by this configuration.

In FIG. 2, the substrate region is indicated at 21, the gate oxide at 23, the gate electrode at 25 and the field oxide at 27. A dielectric overcoat PSG or BPSG 29 covers the structure except where the contacts penetrate the overcoat.

The substrate 21 has a planar surface which is <100> beneath the gate oxide region 25, and the field oxide 27 extends into the P or N substrate 21, along the crystal orientation plane <111> to provide the transition regions 37.

Looking at FIG. 1, the problem areas are indicated by the dotted circles 51 and 52, along the channel edges, wherein the parasitic devices affect the threshold value of the desired transistor 11. This is caused by the overlap of the gate electrode 25, over the field oxide regions 27, and the transition regions from <100> to <111> occurring underneath the overlap, to set up parasitic transistors which develop undesirable paths between the source and drains 13 and 15. An oxide grown on a <111> plane tends to accumulate more charge than oxides grown on <100> planes. Thus, the device is subject to the parasitic influences with respect to threshold voltages and fails to exhibit hardness tolerance to total dose radiation. The parasitic transistors tend to create deleterious leakage paths from source to drain when the transistor is normally in the off state.

FIGS. 3 and 4 show an NMOS or PMOS device in accordance with an embodiment of the present invention wherein one overlap has been eliminated and the transitions to <111> plane have been eliminated, thereby enhancing the hardness of the device and improving its performance relative to parasitic effects. The improved device 61 includes a source region 63, drain region 65 and gate region 67.

In both figures, it may be seen that the gate electrode 69 does not overlap the field oxide 71 on the right hand side of the device, but where the gate electrode metal conductor or interconnect 73 is taken from the gate region 67, overlap of the left region is still present. However, the gate is self-aligned in that the metal 73 is confined to the gate electrode region 69, with the sole exception of the leadout metal conductor 73, i.e., the metal does not overlap the gate electrode in the channel region.

In FIG. 4, it will be seen that the transition is avoided on all sides by preventing the field oxide 71 from consuming the N or P-doped silicon substrate 81, thereby leaving only the <100> region of the substrate 81 beneath the gate oxide region 68 and the field oxide regions 71. This is accomplished by the use of a layer of polysilicon over the wafer substrate 81 with the active region 83 being protected by a silicon nitride layer while the field region of the polysilicon is at least partly consumed to convert the polysilicon to field oxide 71, without allowing the conversion to extend into the silicon substrate 81.

In FIG. 5, the first step is to grow the gate oxide 109 to a thickness of the order of 100 to 1000 Angstroms, depending upon the particular application and voltage range to be employed. The wafer 113 is doped p type and is of the high resistivity type, preferably exceeding 10 ohms-centimeter. Photoresist 110 is deposited on the oxide layer 109 and the well mask 112 (FIG. 5A) is applied atop the photoresist layer 110 in order to open the PMOS well region. The photoresist layer 110 is exposed through the well mask 112 resulting in solubility in the well covering photoresist, which is washed away and the oxide cleaned to bare silicon in preparation for the phosphorus implant shown as the arrows 115, in order to form the N-doped well 116 (FIG. 6).

In FIG. 6A, there is shown contact mask 101 having NMOS openings 103 and 105 and PMOS openings 103' and 105'. These openings permit the photoresist layer 120 to become soluble due to light impingement through the apertures or openings, such that the upper surface of silicon wafer 113 is exposed in the source and drain regions 104, 104' and 106, 106'.

A summary of the steps employed thus far are as follows:
1. grow oxide
2. apply photoresist
3. expose well mask
4. implant phosphorus
5. strip resist
6. grow oxide and drive in the well
7. strip oxide
8. grow gate oxide.

This oxide is identified at 119 in FIG. 6.

The next step is to apply photoresist 120, and utilizing the mask 101 of FIG. 6A etching the oxide off from the soluble areas of photoresist 120 which correspond to the contact regions established by mask 101. The next step is to strip the photoresist 120, leaving the gate oxide 119 on the bare silicon of wafer 113 with openings 104, 106 for the source and drain of the NMOS devices being fabricated and openings 104' and 106' for the source and drain of the PMOS devices being fabricated.

In FIG. 7, a layer of undoped polysilicon 131 is laid down over the gate oxide 119 to a thickness of preferably 5000 Angstroms. This is followed by a deposit of a nitride layer 133 to a thickness of approximately 1000 Angstroms. Lastly, a low temperature oxide layer (LTO) 135 is deposited to a thickness of approximately 6000 Angstroms.

In FIG. 8, there is shown double active region mask 150 having opaque active segments 151 for the NMOS devices and 153 for the PMOS devices. This arrangement (FIG. 9) is shown relative to the contact mask 101 openings 103, 105 and 103', 105'. The purpose of this showing is to understand how the total self alignment is built into the successive use of the masks which overlie the previous masks employed.

Figure 10:
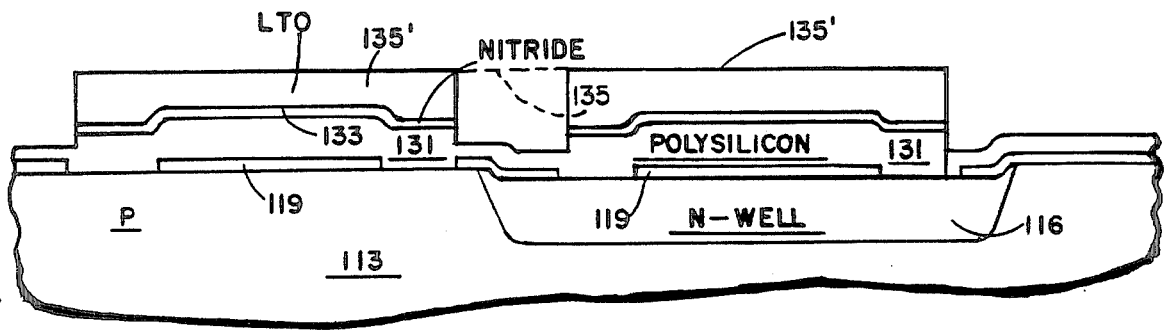
FIG. 10 shows the etching step taking place around the active region to remove the LTO layer, nitride layer and part of the polysilicon layer.

In FIG. 10, photoresist (not shown) is applied over the structure of FIG. 7, employing the active region mask 150 to protect both of the active regions, i.e., n-channel and p-channel as shown by the low temperature oxide segment 135' and 135" illustrating the etching away of the low temperature oxide layer 135, nitride layer 133 and a portion of the polysilicon layer 131, everywhere except in the active region of the NMOS and the PMOS devices. The partial etching of the polysilicon layer 135 should remove approximately 2500 Angstroms of polysilicon in order that subsequent oxidation will develop field oxide having a height to provide preferably a CMOS planar device grouping.

An example of a typical calculation is 2500 Angstroms of polysilicon are dry etched in a conventional plasma etching equipment, such as a "Dry Tech" device at a rate of 900–1000 Angstroms/min. Thus, 2½ minutes will consume 2500 Angstroms. The remaining polysilicon is oxidized in a steam environment at a temperature of 1000 degrees C. for a period of 60 minutes to a thickness of 6000 Angstroms. Care must be taken to ensure that the pyrogenic water system process used is stopped before the bulk silicon is oxidized. For further details of this conventional processing, see "VLSI FABRICATION PRINCIPLES, by Ghandhi, copyright 1983, page 385.

Figure 11:
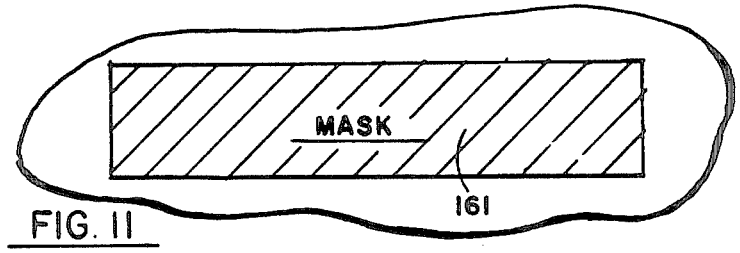
FIG. 11 shows the n-channel field implant mask which protects the p-channel region against the n-channel field implant.
Figure 12:
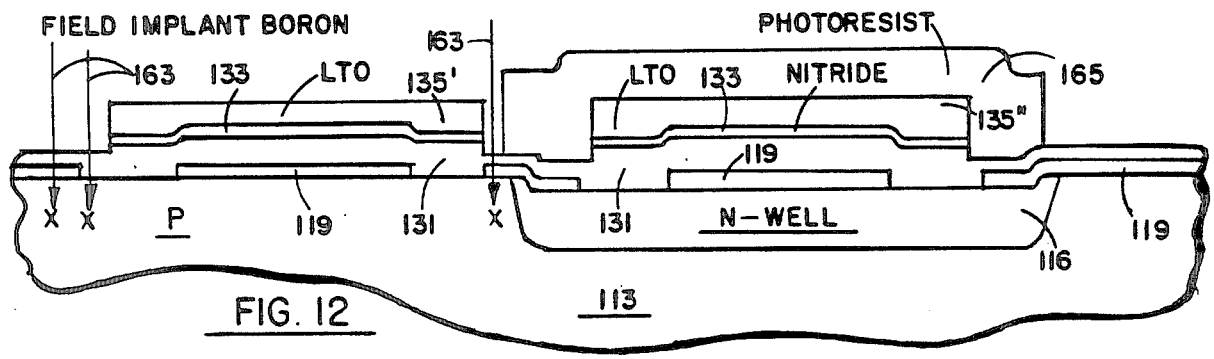
FIG. 12 shows the photoresist protecting the p-channel regions, the LTO protecting the n-channel active region, and the (boron) field implant taking place in the n-channel field regions.

After the resist is stripped from the structure of FIG. 10, the active protective mask 161 of FIG. 11 is used to protect the p-channel devices during field implant in the n-channel field regions as indicated by the arrows 163 implanting boron ions into the wafer 113. The photoresist layer 165 laid down to protect the p-channel devices may be of the order of 12,000 Angstroms thick in order to shield against the boron ions. The implanter employed for the field implant is capable of 100 to 200 Kev and implants the ions a depth of 0.1 to 0.25 microns into wafer 113. In reality, the n-channel devices or active regions are protected by LTO 135′ whereas the p-channel devices are protected by the photoresist 165 over LTO 135″.

Figure 13:
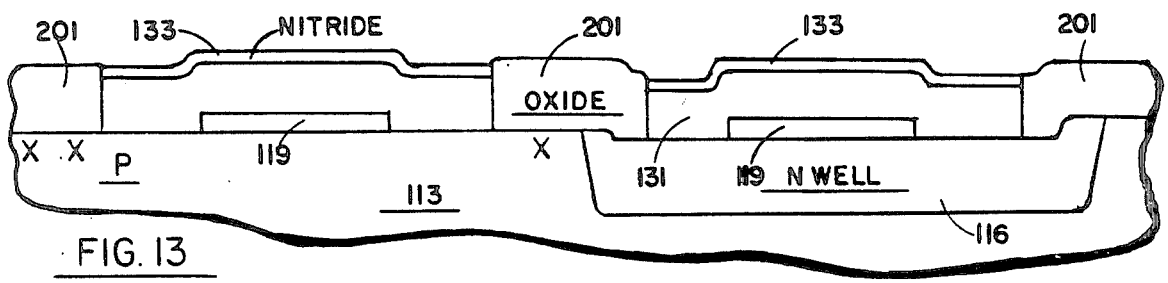
FIG. 13 shows the LTO removed from both p and n active regions, and oxidation of the remaining polysilicon to form field oxide.

Next, the resist 165 is stripped, followed by stripping of the LTO 135′ and 135″ in order that the field oxide 201 may be grown with the nitride layer 133 serving to prevent oxidation in the active regions, as shown in FIG. 13.

Figure 14:
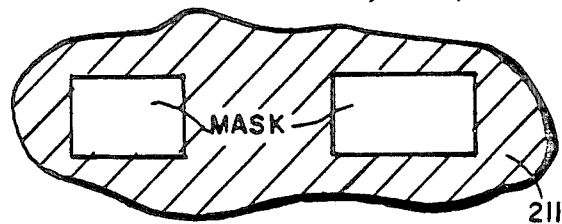
FIG. 14 shows the p-channel source-drain mask used to open the p-channel sources and drains.
Figure 15:
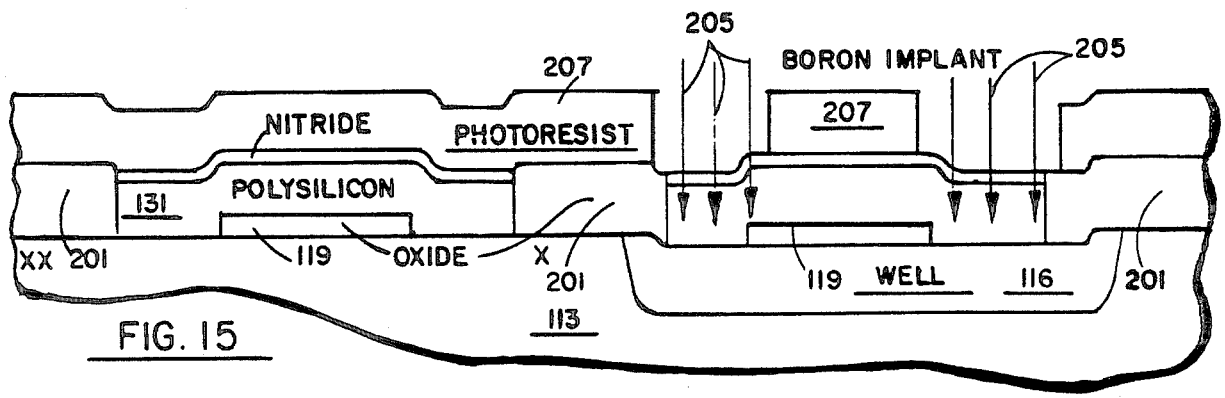
FIG. 15 shows the n-channel protected by photoresist during the implant (boron) step for the p-channel devices.

FIG. 14 shows the source and drain boron implant mask 211 for the p-channel devices, and FIG. 15 shows the boron ions being implanted, as represented by arrows 205 in FIG. 15. The photoresist layer 207 was applied and the mask opened the source and drain regions for the boron implant on the p-channel side. The implant of boron ions is carried on utilizing a 120 KeV implanter at $1 \times 10^{15}$ ions per cm$^2$. Next, the resist 207 is stripped.

Figure 17:
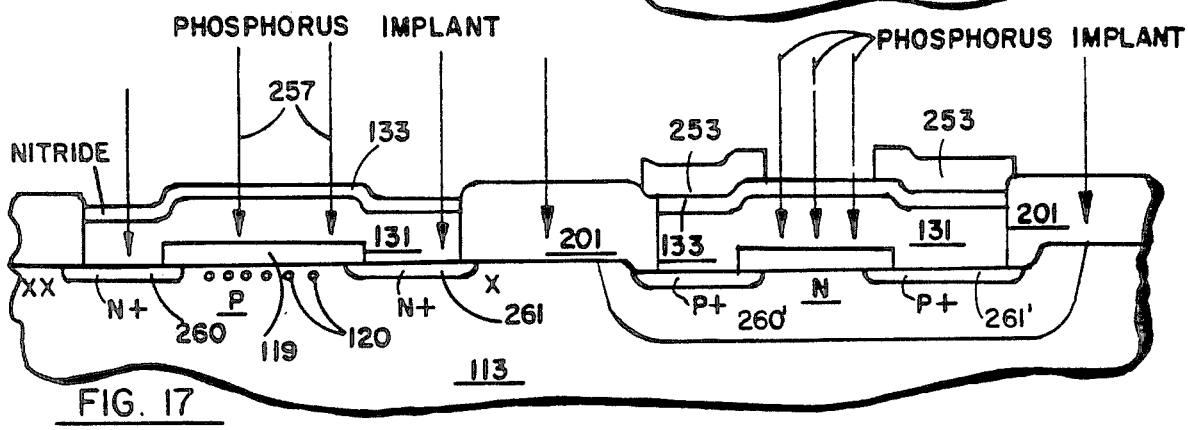
FIG. 17 shows the phosphorus implant into the polysilicon over the n-channel devices.

In FIG. 17, low dose boron is concurrently implanted into the channels in conventional fashion to adjust the threshold values. (This step is not illustrated but uses 200 KeV low dose implant).

Figure 16:
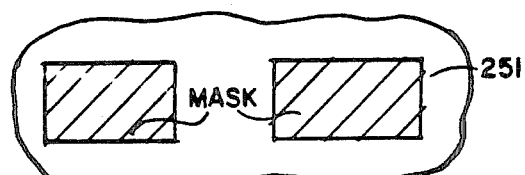
FIG. 16 shows a p-channel source and drain protective mask for shielding the sources and drains from the subsequent boron channel implant, and phosphorus polysilicon implant.

In FIG. 16, mask 251 is provided to protect the source and drains of the p-channel device while phosphorus is implanted into the polysilicon layer 131. Thus, the first step is to apply photoresist 253, expose it, and remove the soluble photoresist to leave the source and drain regions of the p-channel devices protected by photoresist 253, as shown in FIG. 17. The phosphorus implant is illustrated by arrows 257 and doses the polysilicon layer 131, only. This is accomplished by using 100 Kev and a dose of 1 to $5 \times 10^{15}$ ions/sq. cm.

The next step is to strip the resist 253 and optionally activate the implants to form the sources and drains. Thus, the n-channel sources are shown at 260 and the p-channel sources at 260′ whereas the n-channel drains are shown at 261 and the p-channel drains at 261′. Activation is carried out at 925° C. for 60 minutes and serves to activate all three implants, boron source and drain for p-channel, low dose boron channel threshold adjust, and phosphorus implant. Alternatively, activation can be postponed until the cross-over oxide is grown in FIG. 25.

Figure 18:
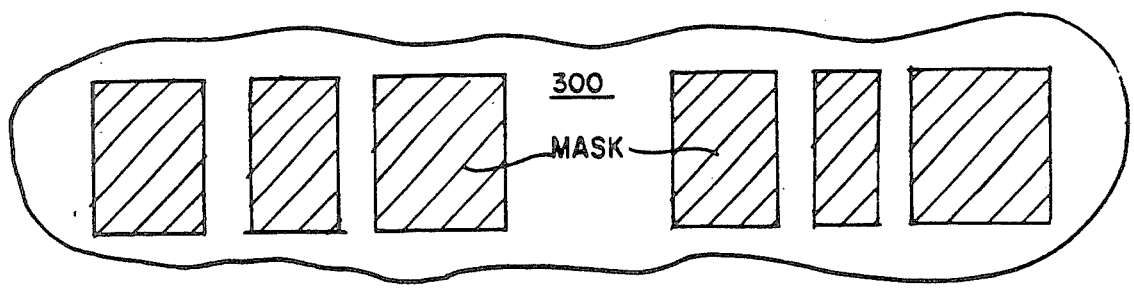
FIG. 18 is a gate-contact mask for both p-channel and n-channel devices.
Figure 19:
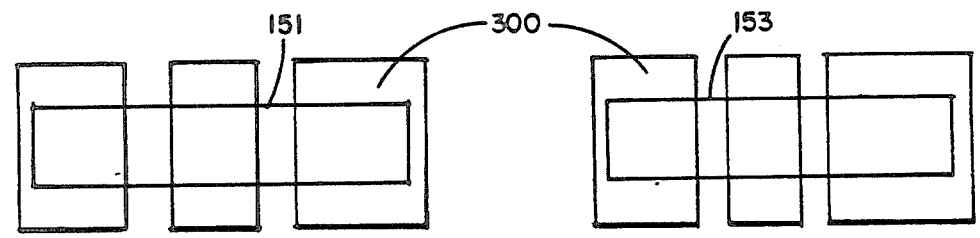
FIG. 19 shows the gate-contact mask for the p and n channel devices relative to the active region for each device.

In FIG. 18, there is shown the gate-contact mask 300 for both channels. FIG. 19 shows an overlay of mask 300 relative to the active region masks 151 and 153.

Figure 20:
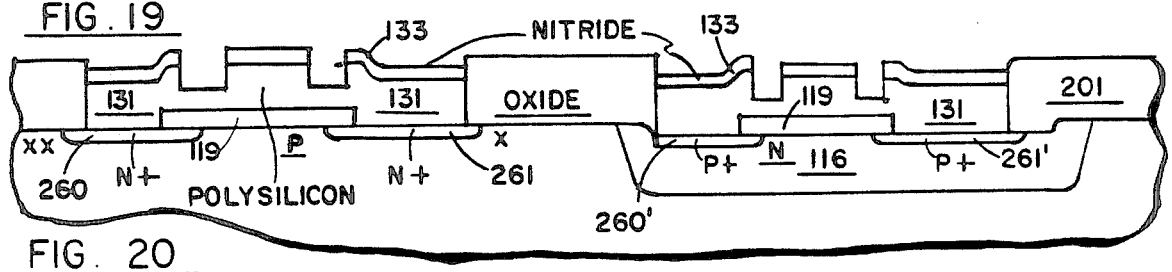
FIG. 20 shows the p-channel and the n-channel delineated with the silicon nitride layer opened on each side of the channels and a portion of the polysilicon removed where the nitride is opened.
Figure 21:
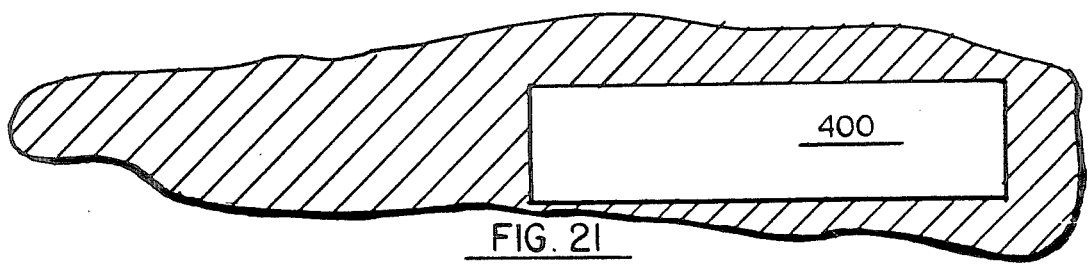
FIG. 21 shows the open active mask for the p-channel devices.

In FIG. 20, photoresist (not shown) is applied over wafer 113, and exposed through the gate-contact mask 300 to permit etching through the nitride layer 133 on each side of the n-channel and the p-channel regions. Etching is continued until about ½ of the thickness of polysilicon layer 131 is removed in these locations. If the polysilicon layer 131 is 5000 Angstroms thick, approximately 2500 Angstroms is removed adjacent the channels in order that the sources and drains may be extended inwardly to abut or define the channel regions.

Figure 22:
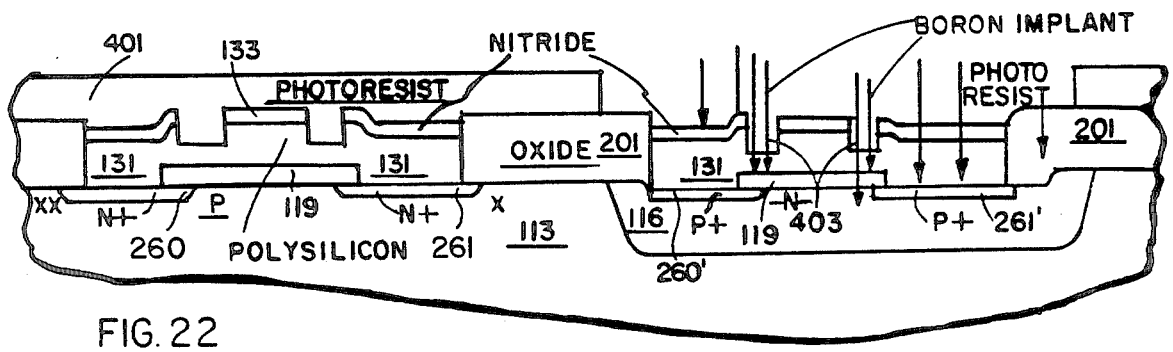
FIG. 22 shows the boron implant via the p-channel active mask to extend the source and drain to the channel region.

This is best shown in FIG. 22, but first the photoresist (not shown) is removed from the structure of FIG. 20 and the active outline mask 450 is employed to mask the p-channel devices after the photoresist 401 has been applied to the wafer 113. The well mask 112 of FIG. 5 could be employed in lieu of mask 400. After the PMOS devices are opened, due to the dissolving of photoresist 401 over these devices, boron, shown by the arrows 403, is implanted into the sources and drains to complete the p-channel devices. The boron is implanted at 90 KeV using a dose of approximately $1 \times 10^{15}$ atoms per cm$^2$ to form a standard device. Alternatively, boron at 90 KeV with a dose of approximately $5 \times 10^{14}$ atoms per cm$^2$ will form LDD structures (lightly doped drain) for short channel devices with improved reliability by reducing hot electron injection. Also, as a further alternative, boron difluoride (BF2) can be used to maintain channel length integrity. Finally, the photoresist 401 is stripped.

Figure 23:
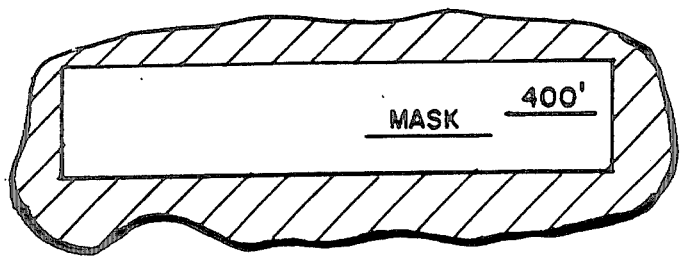
FIG. 23 shows the open active mask for the n-channel devices.
Figure 24:
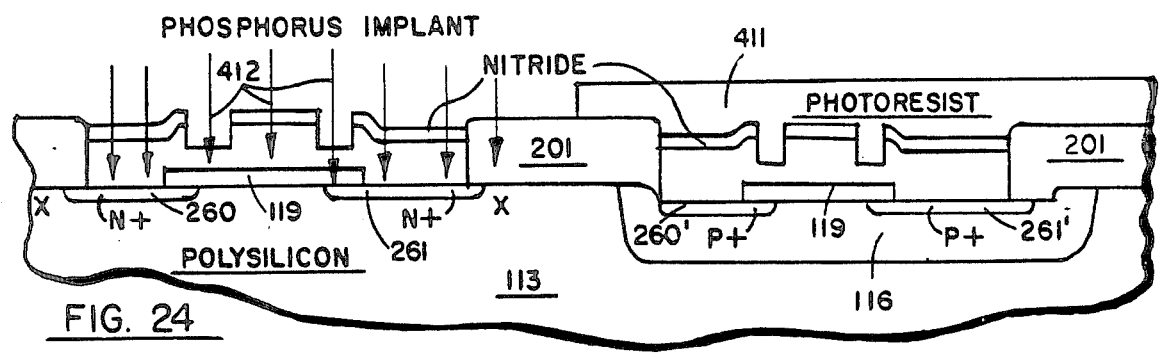
FIG. 24 shows the p-channel devices protected during phosphorus implanting of the source and drain for the n-channel devices.

In FIG. 23, mask 400′ is employed over the NMOS devices to open the new photoresist layer 411 for purposes of implanting phosphorus to extend the NMOS source 260 and drain 261 to the channel edges. Thus, mask 400′ protects the p-channel with photoresist 411 during the phosphorus implant shown by the arrows 412. An implanter capable of 200 KeV at $3 \times 10^{15}$ atoms per cm$^2$ forms a standard device for completing the sources and drains. Alternatively, an implanter capable of 200 Kev at $5 \times 10^{14}$ atoms per cm$^2$ forms LDD (lightly doped drain) structures for short channel devices for improved reliability by reducing hot electron effects.

Figure 25:
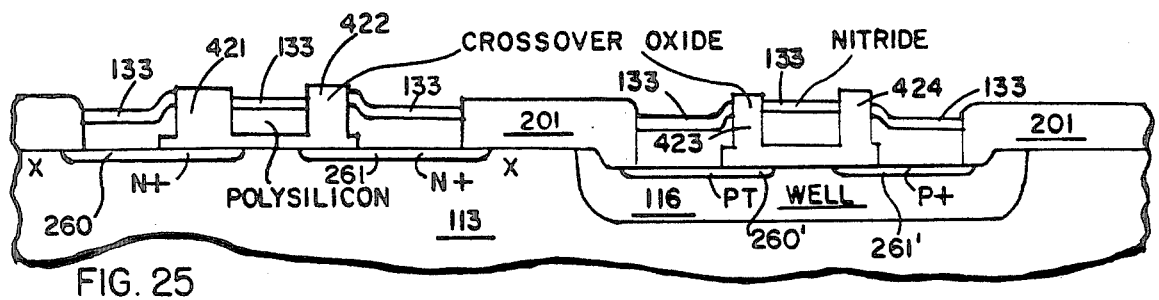
FIG. 25 shows the activation of the source and drain implants and growth of cross-over oxide.
Figure 26:
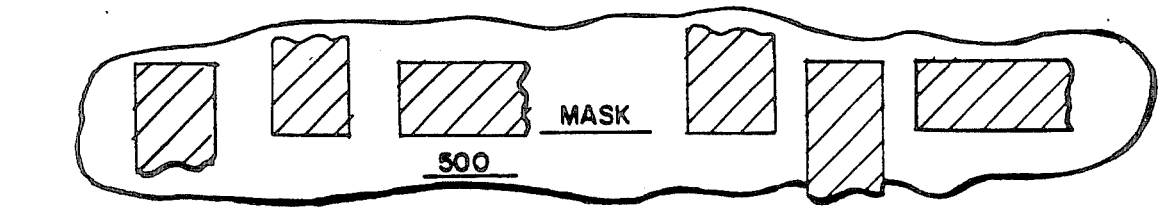
FIG. 26 shows the single metal mask for making contact to the source, drain, and gate electrodes of the p and n-channel devices.
Figure 27:
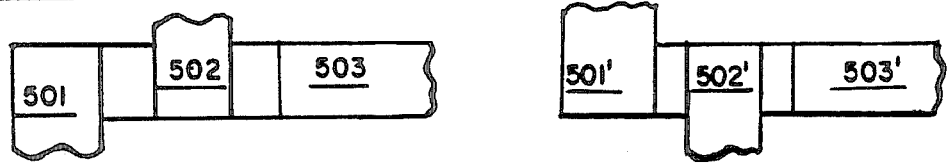
FIG. 27 is a top plan view of the completed device of FIG. 28 showing the single channel to field oxide overlap of the gate conductors.
Figure 28:
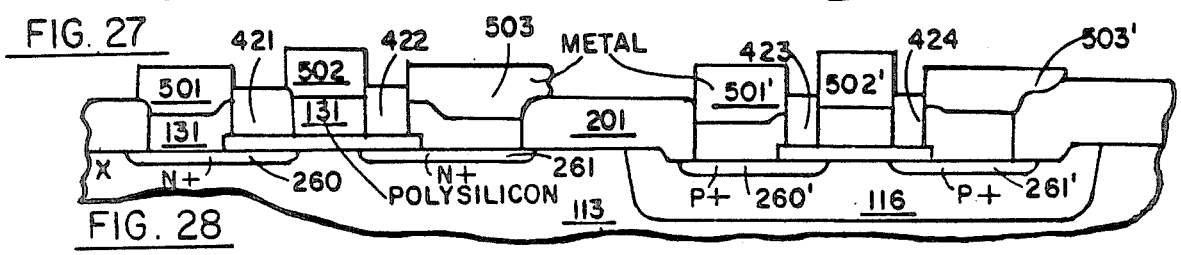
FIG. 28 is a cross-sectional view of the CMOS arrangement showing the n-channel device on the left hand side and the p-channel device on the right hand side.

In FIG. 25, the growth of cross-over oxide segments 421, 422, 423 and 424 is represented. In this step, all four previous boron and phosphorus implants may be activated during the growth of the cross-over oxide which preferably occurs at 950° C. for a period of 60 minutes. Thereafter, the nitride layer 133 is removed by etching in conventional manner and metal is deposited covering the structure of FIG. 25 without the nitride layer 133. Metal mask 500 is applied over a layer of photoresist and the photoresist and metal are etched away except for the interconnects identified as source interconnects for the n-channel 501 and for the p-channel 501′, gate interconnects 502 and 502′, and drain interconnects 503 and 503′ in FIG. 27. The next step is to strip the photoresist (not shown) and sinter the completed device of FIG. 28.

It will be noted that in this device there is no transition from the <100> plane to the <111> plane because the field oxide is all above the wafer 113. Moreover, there are only single overlaps of the channel interconnects 502 and 502' over the field oxide surrounding each device. Also, it should be noted that while radiation tolerance is basically generated by the structure of the NMOS, nevertheless, supplying the same principles to the PMOS provides a harder CMOS device than if only the NMOS side were hardened.

Figure 29:
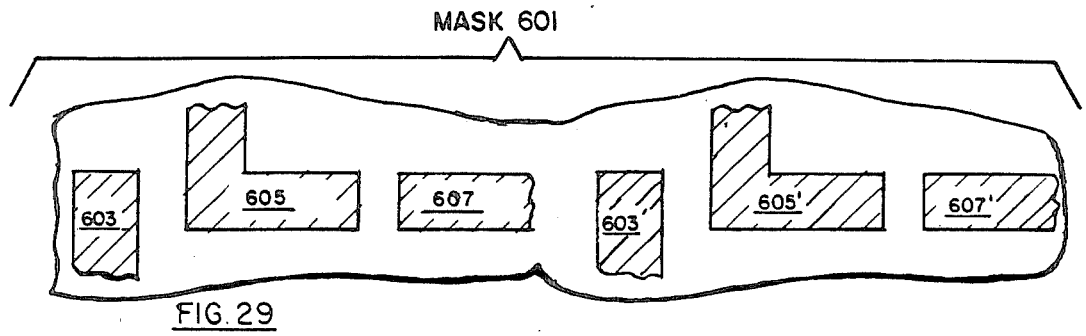
FIG. 29 shows a mask for a different embodiment of the CMOS arrangement wherein the gate conductors do not exit the active region over the channel area but rather are offset in the direction of the source or drain.

FIGS. 29 through 31A show the preferred CMOS embodiment wherein even the single field oxide overlap in the channel region is eliminated and the dot devices have the advantage of no overlap and no transitional regions. This is implemented by bringing the gate electrodes out over a source or drain area, thereby avoiding the parasitic effects. In FIG. 29 there is provided a proper metal mask 601 for the structure of FIG. 25 (with the nitride layer removed) in order to develop the metal interconnect plan view of FIG. 30 of the preferred structure of FIG. 31. The opaque areas of the mask 601 include the source interconnects 603 and 603' whereby the photoresist (not shown) laid over the structure of FIG. 25 (without the nitride layer) protects the metallization layer (not shown) normally laid down in conventional manner, from the etch which removes the metal not employed in the interconnects. Thus, in FIG. 30 metal interconnect 604 exactly covers the NMOS source electrode 699 (FIG. 31) and exits the active region generally downwardly as shown in the plan view of FIG. 31.

Figure 30:
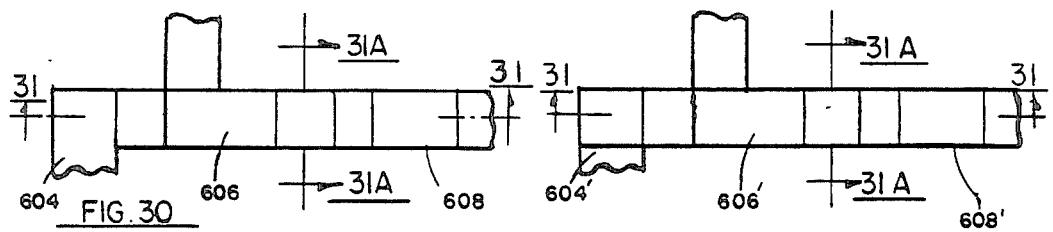
FIG. 30 shows a top plan view of the device of the completed device of FIG. 31 without overlap.

Of paramount importance is the fact that the mask 601 (FIG. 29) includes the offset opaque region 606 for making contact with the gate electrode 698 (FIG. 31), exactly covering the same and extending to the left over polysilicon 692 between the gate electrode 698 and source electrode 699 to exit upwardly of the active region, as shown in FIG. 30. This ensures that the conductor does not exit the channel region over the field oxide to produce parasitic problems.

Opaque region 607 of the mask 601 of FIG. 29 is provided to form the drain lead 608 as shown in FIG. 30 in order that it may make contact and exactly conform to the drain electrode 697 (FIG. 31) and exit the active region to the right over oxide 696.

Figure 31:
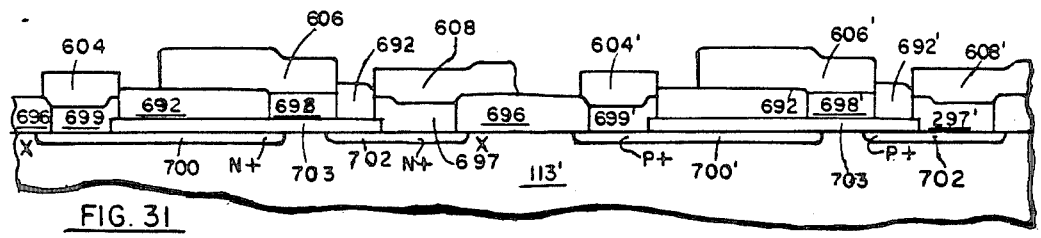
FIG. 31 shows the completed CMOS device without channel overlap or field oxide transition regions.
Figure 31A:
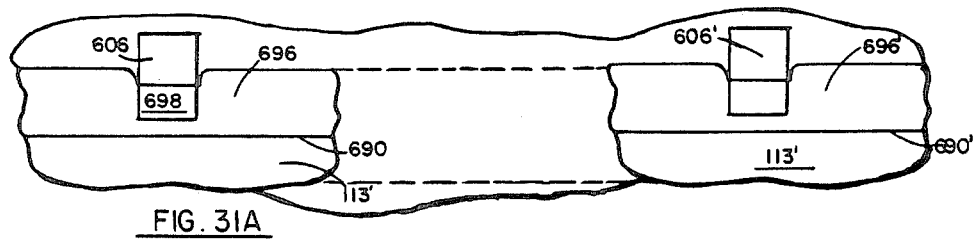
FIG. 31A is an orthogonal view through the gate structure, taken along the planes 31A—31A of FIG. 30 to show the conformity of the gate conductor to the gate electrode structure.
Figure 32:
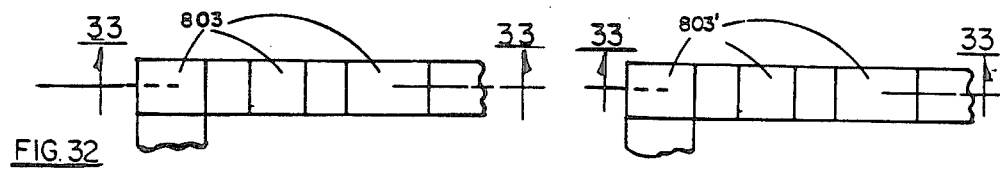
FIG. 32 is a metal mask for laying out a different embodiment of the invention wherein slugs of metal are placed atop the source, drain, and gate electrodes and interlevel dielectric (1LD) is utilized to locate the second layer of metal above the field oxide sufficiently that the gate conductors may be brought out in the channel regions and are spaced remotely enough electrically to avoid parasitic effects.
Figure 33:
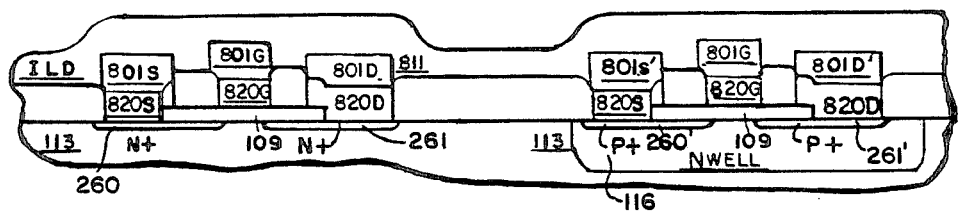
FIG. 33 shows both metal layers with ILD thereover.
Figure 34:
FIG. 34 shows the VIA mask for opening apertures to the second metal for the final metallization or conductor layout.

FIG. 31A shows an orthogonal cross section taken on the plane 31A-31A of FIG. 30 to indicate that metal interconnect 606 does not overlap gate electrode 698 to spill over onto the field oxide 696 in the channel region. This figure also shows the demarcation line 690 between wafer 113' and field oxide 696 thereby revealing the lack of any transition regions.

Returning to FIG. 31, it will be seen that the NMOS device comprises source 700, drain 702, gate oxide 703, field oxide 696, cross over oxide 692, source electrode 699 with interconnect or conductor affixed thereto shown at 604, gate electrode 698 with gate interconnect 606 affixed thereto and drain electrode 697 with drain interconnect 608 affixed thereto.

The same structure obtains for the p-channel wherein mask 601 includes the source, gate, and drain interconnect opaque regions 603', 605' and 607' which enable the laying down of metal interconnect 604' for the source, offset metal interconnect 606' for the channel and drain interconnect 608'. The PMOS device in FIG. 31 comprises source 700' and drain 702' with gate oxide 703' covered by gate electrode 698' connected to gate interconnect conductor 606'. The source conductor 604' is connected to source electrode 699' and the drain conductor 608' is connected to drain electrode 697' with field oxide 696' abutting this electrode. Similarly, FIG. 31A shows the conformance of the conductor 606' to its gate electrode 698' in area.

Figure 30A:
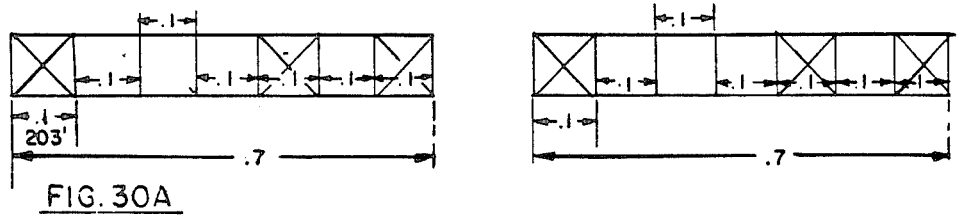
FIG. 30A shows the active regions of the CMOS arrangement with dimensioning applied thereto to illustrate the sub-micron dimensions of the NMOS and PMOS devices and the contact regions measuring only 0.1 micron by 0.1 micron.

FIG. 30A shows the sub-micron NMOS side to the left of the figure and the sub-micron PMOS device to the right of the figure. The dimensioning is the same with the source electrode 699 and contact 604 therefore measuring 0.1 micron by 0.1 micron.

The gate control electrode 698 is precisely covered by metal measuring 0.1 micron by 0.1 micron and this lead 606 extends left 0.2 micron where it leaves the active region in a direction extending upwardly.

Similarly, the drain region measures 0.1 micron by 0.1 micron and the same is true for the respective regions of the PMOS devices.

The contacts are made this small because of the oversized contact masks which overlies the active area masks which are also overlaid by the gate contact masks such that only the regions common to all three masks ultimately become the contact regions, and of course these regions are limited by the dimensions of the active region. This is best appreciated from considering the orientation of the first two masks in FIG. 9 and third mask relative to the second mask in FIG. 19. It may also be appreciated that the gate contact mask defines the channel and, consequently, all three electrodes relative thereto thereby providing self alignment. Total self alignment is ensured by the fact that the contacts are limited to portions of the active areas of each device. Today, many E-beam steppers exist which have spot sizes 0.1 micron or less and they are simply programmed in accordance with these masks to open up the necessary vias to provide the total self-aligned contacts described. One such E-beam fabricator available at the present time is manufactured by Varian Associates under the styles VLS-20, VLS-40 and VLS-80. The latter device provides the resolution or alignment control of 0.1 microns and a beam size of 0.1 micron. Thus, utilizing one of these devices and the totally self-aligned process described herein, contacts as small as 0.1 of a micron by 0.1 of a micron are readily fabricated. It should be noted in FIG. 30 that the gate interconnect lead 606 may use less offset and reduce the overall length of the active portion to 0.6 micron.

In this process initially, source and drain contact mask 101 (FIG. 6A) opens oversize apertures to the bare silicon. Superposition of the active mask 150 of FIG. 8 and gate contact mask 151 of FIG. 19 ensures that the dimensions of the respective electrode surfaces therebeneath cannot be greater than the width of the active area. Similarly, the spacing between contacts is dictated by the gate-contact mask and the metal mask.

After source and drain contact mask 101 of FIG. 6A opens oversize apertures to the bare silicon, superposition of the active mask 150 of FIG. 8 selects only a portion of each such aperture. Then, superposition of gate-contact mask 300 of FIG. 18 spaces the source, drain and gate for total self alignment. Metal mask 601 of FIG. 29 is simply indexed to the position of the active mask, thereby ensuring the FIG. 30A layout and dimensioning.

This arrangement may be utilized in all embodiments hereof, but certainly this process is not limited to such small contacts or devices, but may accommodate a wide range of larger sizes with inherent accuracy and total alignment.

A further embodiment of the invention is shown in FIGS. 32–36 which is the double metal embodiment utilizing a first metal layer as simply spacing material to space the gate interconnect above the field oxide sufficiently as to avoid electric potential interferences in the underlying field oxide. While this embodiment is illustrated with the single overlap type gate electrode interconnects, it will be appreciated that the same principles of the previous embodiment may be applied such that an offset of the gate contact interconnects may be provided, even further to enhance hardness.

Starting with construction of FIG. 25 absent the nitride layer, a layer of first metal is applied over the wafer 113 and is then covered with photoresist, with mask 803, 803' being applied over the metal and the photoresist exposed, with the soluble photoresist removed by etching, and then, the unprotected metal is etched away, followed by stripping of the photoresist to provide the metal plugs 801S over source electrode 820S, 801G over gate electrode 820G and plug 801D over drain electrode 820D for the NMOS side. Similarly, the metal plugs 801S', 801G' and 801D' are formed in the p-channel device.

Next, a layer of ILD (Inter Level Dielectric) 811 is applied over the wafer including the metal plugs. This dielectric may be CVD oxide or LTO, as used heretofore.

Next, photoresist (not shown) is applied over the ILD 811, and then VIA mask 813, is positioned over the photoresist such that the apertures 815S, 817G and 819D for the NMOS channel lie directly over the metal plugs 801S, 801G, and 801D. The same is true for the apertures 815S', 817G' and 819D' for the PMOS devices.

The photoresist is then exposed to actinic light and rendered soluble within the apertures such that dry etching opens the ILD 811 to the first metal plug 801S, 801G, 801D and the corresponding plugs for the p-channel.

Figure 35:
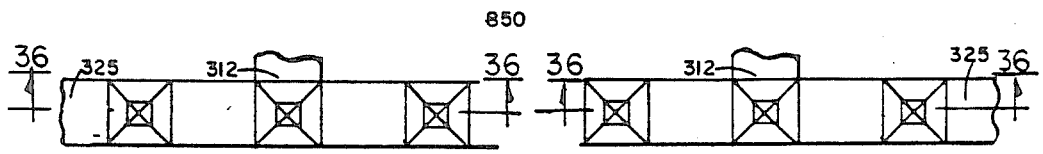
FIG. 35 shows the VIA openings relative to the contact regions (indicated by large X's) in the active areas of the NMOS and PMOS devices; and, FIG. 36 is a view of the completed double metal layer CMOS device.

Next, the photoresist is stripped and a second layer of metal is deposited over the entire wafer. Then, the metal 2 (second layer) mask 850 of FIG. 35 is positioned over the VIA openings. The photoresist is rendered soluble where not protected by the mask 850 and the metal is then etched where not protected by photoresist. Photoresist (not shown) is stripped and wafer is submitted to to a sintering process to establish good contacts between the two metals and the polysilicon so as to complete the structure of FIG. 36. The second metal is identified at 851S, 851G, and 851D for the NMOS device and 851S', 851G', and 851D' for the p-channel, being respectively connected to the sources, gates and drains.

Thus, it will be seen that the metal interconnect 851G for the gate overlaps the transition between the channel and field oxide but its effects are completely diminished because of the spacing between the metal and the substrate 113. It may be seen that the spacing is now made up of field oxide 845 and ILD 811.

Figure 36:
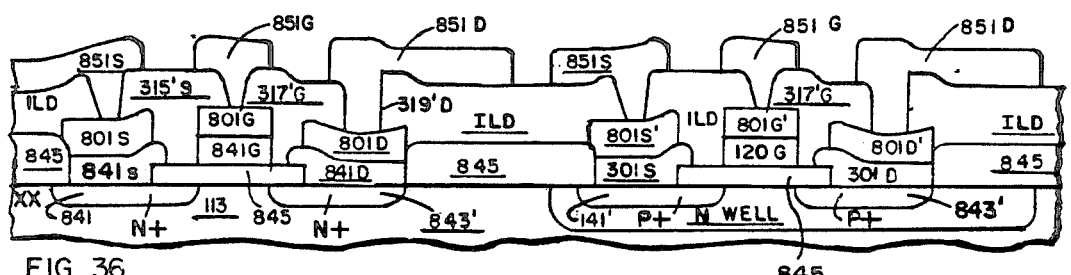

In FIG. 36 the NMOS device is identified as having source 841, drain 843, gate oxide 845. The source electrode is shown at 841S, gate electrode at 841G and drain electrode at 841D. The same is true with the right hand or PMOM devices including the "'" of the numbers utilized in the left channel.

In summary, the device of the present process exhibits reduced gate capacitance with improved speed performance and enhanced immunity to total dose radiation, primarily due to elimination of the <100> to <111> transitions and channel overlaps, as well as the double metal in that embodiment and the lack of overlaps in those embodiments.

It should now be appeciated that the present invention provides the most minimal size MOS devices attainable because they consist primarily of active elements, except for the cross-over oxide which may be made as small as 0.1 micron wide.

In the prior art, the minimum overlap of active region (FIG. 1) relative to contact (electrode areas 58) had to be at least 0.8 micron. But, in the present invention, since the electrodes 58 are doped with the same material as the source and drain junctions, e.g., (N+) being connected, there is no possibility for the metal interconnect to short circuit from junction to substrate as is the problem with the prior art resulting in the requirement for large area overlap.

The electrodes, being polysilicon, prevent the metal from spiking through shallow junctions, i.e., sub-micron type junctions.

The contacts (electrodes) are of the order of 0.1 microns because:

(a) photoresist and nitride delineate the electrodes, (b) electrode integrity is maintained by rapid oxidation of the surrounding polysilicon while the polysilicon under the nitride button is preserved.

These factors are common to all embodiments of this invention.

In FIGS. 6 through 20, significant steps are illustrated for making the sub-micron contacts. It is necessary that the polysilicon 131 make contact with the already formed sources and drains because the delineated electrode portions 131 are polysilicon which are covered by the nitride buttons 133. The dimensions of these electrodes is established by the solid regions of mask 300. The masks are used for larger sizes. For smaller sizes, the E-Beam is blanked out for these regions when making contacts down to 0.1 by 0.1 micron under computer control. Many current E-Beam micro-fabricators have spot sizes down to 0.1 micron.

Thus, oxidization of the polysilicon unprotected by the nitride buttons fixes these sub-micron contact areas.

These techniques obtain throughout all embodiments presented herein.

What is claimed is:

1. A process for providing CMOS sub-micron n-channel and p-channel devices on a p-doped silicon wafer, comprising the steps of:

growing a layer of oxide on the wafer;

applying a layer of photoresist over the oxide;

using a well mask to open a region for the p-channel device to bare silicon;

implanting phosphorus ions in the p-channel region to initiate the formation of n-doped well;

driving in the ions to complete the well, while growing a layer of oxide in the p-channel region;

stripping the oxide;

growing gate oxide;

applying a layer of photoresist over the wafer;

using a source and drain contact mask to open source and drain openings through the photoresist and oxide to bare silicon for both channels;

depositing a layer of polysilicon over the wafer including the bare silicon and the opened oxide;

depositing a layer of nitride over the polysilicon;

depositing a layer of low temperature oxide over the nitride;

depositing photoresist over the low temperature oxide;

using a double active region mask to protect the channel and open field oxide regions elsewhere;

etching the photoresist, low temperature oxide, nitride, and a portion of the polysilicon outside the active regions;

depositing photoresist;

using an active region mask to protect the p-channel region with a layer of photoresist;

field implanting boron ions into the field oxide region around the n-channel region while protecting the p-channel region from the implant;

stripping the photoresist layer, low temperature oxide and growing field oxide using the nitride as masks for the active regions;

depositing photoresist;

using a p-channel region source and drain mask to open source and drain regions in the p-channel region;

implanting boron ions into said source and drain regions to dope them P+;

implanting a low dose of boron ions into the n and p channels to adjust threshold voltages;

using an opaque source and drain mask and photoresist to cover the source and drain regions for the p-channel;

implanting phosphorus ions into the polysilicon layer;

stripping the photoresist;

activating all implants including:

boron implant of the source and drain for the p-channel, the low dose boron for both channels for threshold adjustment, and the phosphorus implant into polysilicon;

applying photoresist;

using gate-contact mask to delineate gaps in the nitride adjacent both sides of channel electrode regions being formed; and etch away the delineated nitride and part of the polysilicon;

applying photoresist over the n and p-channels and opening the p-channel regions;

implanting the source and drain of the p-channel region to extend the P+ source and drains of the p-channel by boron ion implant;

stripping the photoresist;

applying photoresist and opening the n-channel regions;

implanting phosphorus ions to extend the N+ source and drain regions;

stripping the photoresist;

growing cross-over oxide in the gap regions, and activating all implants not previously activated;

etching away the nitride layer;

depositing metal;

applying a layer of photoresist over the metal and using a metal mask to etch the photoresist and metal except for the interconnects to the source for each n and p channel, gate for each n and p channel and drain for each n and p channel;

stripping the photoresist; and, sintering the structure as now completed.

2. The CMOS process of claim 1 wherein at least the n-channel gate conductor is deployed to exit its gate electrode over its associated source or drain, thereby enhancing the radiation hardness of said CMOS device.

3. The CMOS process of claim 1 wherein at least one of said gate conductors is co-extensive with its gate electrode and is deployed to exit its gate electrode on one side of the associated channel only, thereby providing a single overlap in lieu of a conventional double overlap of the associated field oxide to enhance hardness.

4. The CMOS process of claim 1 including the further step of:

deploying a conductive spacer between at least one of the gate electrodes and associated gate conductor to space the conductor substantially above the associated field oxide where it exits the associated channel region thereby enhancing hardness.

5. A process for providing CMOS sub-micron n-channel and p-channel devices on a p-doped silicon wafer, comprising the steps of:

forming an N well in the wafer for a p-channel device;

growing a layer of gate oxide over the wafer;

using a source and drain contact mask to open source and drain openings through the oxide to bare silicon for both channels;

depositing a layer of polysilicon over the wafer including the bare silicon and the opened oxide;

depositing a layer of nitride over the polysilicon;

protecting the channel regions and open field regions to the silicon wafer elsewhere;

etching the nitride and a portion of the polysilicon outside the active regions;

protecting the p-channel region while implanting boron ions into the field region around the n-channel region;

growing field oxide using the nitride as masks for the active regions;

implanting boron ions into the source and drain regions of the p-channel to dope them P+;

implanting a low dose of boron ions into the n and p channels to adjust threshold voltages;

implanting phosphorus ions into the polysilicon layer;

activating all implants including:

boron implanted source and drain for p-channel, the low dose of boron for both channels for threshold adjustment, and phosphorus implant into polysilicon;

applying photoresist;

using a gate-contact mask to delineate gaps in the nitride adjacent both sides of the p and n-channel electrode regions being formed; and etch away the delineated nitride and part of the underlying polysilicon;

implanting the source and drain of the p-channel region to extend the P+ source and drain of the p-channel to the p-channel electrode region by boron ion implant;

implanting phosphorus ions to extend the source and drain of the n-channel to the n-channel electrode region;

growing cross-over oxide in the gap regions, and activating all implants not previously activated;

etching away the nitride layer;

depositing metal;

delineating a source, drain and gate interconnect conductor for each channel; and, sintering the structure as now completed.

6. The CMOS process of claim 5 wherein at least the n-channel gate conductor is deployed to exit its gate electrode over its associated source or drain, thereby enhancing the radiation hardness of said CMOS device.

7. The CMOS process of claim 5 wherein at least one of said gate conductors is co-extensive with its gate electrode and is deployed to exit its gate electrode on one side of the associated channel only, thereby providing a single overlap in lieu of a conventional double overlap of the associated field oxide to enhance hardness.

8. The CMOS process of claim 5 including the further step of:

deploying a conductive spacer between at least one of the gate electrodes and associated gate conductor to space the conductor substantially above the associated field oxide where it exits the associated channel region thereby enhancing hardness.

* * * * *